(12) United States Patent
Wang et al.

(10) Patent No.: US 9,484,376 B2
(45) Date of Patent: Nov. 1, 2016

(54) SEMICONDUCTOR ISOLATION STRUCTURE AND MANUFACTURING METHOD THEREOF

(71) Applicant: TAIWAN SEMICONDUCTOR MANUFACTURING COMPANY LTD., Hsinchu (TW)

(72) Inventors: Yu-Yi Wang, Tainan (TW); Keng-Ying Liao, Tainan (TW); Po-Zen Chen, Tainan (TW); Yi-Hung Chen, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/291,512

(22) Filed: May 30, 2014

(65) Prior Publication Data

US 2015/0349001 A1 Dec. 3, 2015

(51) Int. Cl.
*H01L 31/02* (2006.01)
*H01L 27/14* (2006.01)
*H01L 27/146* (2006.01)

(52) U.S. Cl.
CPC ....... *H01L 27/1463* (2013.01); *H01L 27/1464* (2013.01); *H01L 27/14621* (2013.01); *H01L 27/14625* (2013.01); *H01L 27/14627* (2013.01); *H01L 27/14687* (2013.01); *H01L 27/14689* (2013.01)

(58) Field of Classification Search
CPC .............. H01L 27/1463; H01L 27/14687; H01L 27/14621; H01L 27/14625; H01L 14/14627

See application file for complete search history.

(56) References Cited

U.S. PATENT DOCUMENTS

| | | | |
|---|---|---|---|
| 7,704,849 B2 * | 4/2010 | Subramanian | H01L 21/3065 257/E21.54 |
| 8,043,518 B2 * | 10/2011 | Takahashi | B41J 2/14233 216/27 |
| 8,742,509 B2 * | 6/2014 | Lee | H01L 29/66795 257/368 |
| 8,822,304 B2 * | 9/2014 | Wang | H01L 29/0649 438/207 |
| 8,859,434 B2 * | 10/2014 | Oishi | H01L 21/30655 156/345.1 |
| 2012/0025199 A1 * | 2/2012 | Chen | H01L 27/1464 257/75 |

* cited by examiner

*Primary Examiner* — Savitr Mulpuri
(74) *Attorney, Agent, or Firm* — Chun-Ming Shih (57) ABSTRACT

The present disclosure provides a method for manufacturing a semiconductor isolation structure, including providing a substrate with a top surface; forming a patterned mask over the top surface; forming a trench through the patterned mask in the substrate by a directional etch comprising nitrogen-containing substance, wherein an aspect ratio of the trench is formed to be greater than about 18, and a ratio of a width of a narrowest portion and a width of a widest portion of the isolation region is formed to be greater than about 0.7; and filling the trench with insulating materials. The present disclosure also provides an image sensing device, including a radiation sensing region with a first isolation region separating adjacent radiation detecting units and a peripheral region, wherein an aspect ratio of the first isolation region is greater than about 18.

11 Claims, 12 Drawing Sheets

SEMICONDUCTOR ISOLATION STRUCTURE AND MANUFACTURING METHOD THEREOF

BACKGROUND

Trench isolation, also known as Box Isolation Technique, is an integrated circuit feature which prevents electrical current leakage between adjacent semiconductor device components. Trench isolation is generally used on CMOS process technology nodes of 250 nanometers and smaller. Semiconductor devices requiring performances to avoid electrical current leakage between adjacent components or also known as electrical signal cross talk would possess trench isolation structure, which includes shallow trench isolation (STI) and/or deep trench isolation (DTI).

For example, semiconductor image sensors are used for sensing light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors that can absorb radiation projected toward the substrate and convert the sensed radiation into electrical signals.

A back side illuminated (BSI) image sensor device is one type of image sensor device. As transistor device size shrinks with each technology generation, existing BSI image sensor devices may begin to suffer from issues related to cross-talk and blooming. It has been found that as image sensor pixel size decreases, the amount of cross-talk between adjacent pixels becomes more of an important issue. In general, cross-talk can be generated from two different sources: (1) optical cross-talk which refers to the ability to optically focus incident light over a pixel through its micro lens and onto the appropriate photosensitive element; and (2) electrical cross-talk which refers to the ability to collect the generated photo carriers in the photosensitive element where they are originally generated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Under current image-sensing devices, generated photo carriers (electrons) are not entirely collected in the photosensitive region where they were originally generated. This is because the photo-generated carriers can diffuse to adjacent photosensitive regions. One method to electrically isolate adjacent pixels given a shallow trench isolation structure is used as part of the isolation structure, is to define deep P-well implanted regions around each pixel. The deep P-well regions are electrically connected to the substrate potential and isolate one pixel from another. However, one drawback of this approach is that some incident photons, especially longer wavelength photons, generate electrons deep in the silicon photosensitive regions.

To avoid losing the signal from the long wavelength photons, the lightly doped P-type region of the photosensitive element shall be deep enough (typically greater than 4 microns). Consequently, a B11 implant of about 2.4 MeV is implemented, which in turn would require a thick photoresist layer (about 8 microns). However, a thick photoresist is impractical to be used in patterning fine geometries.

Alternatively, to pursue a better isolation effect, a deep trench isolation (DTI) structure with a depth great enough that the lightly doped P-type region can be omitted. However, using a directional etch such as a reactive ion etch to form a deep trench having an aspect ratio greater than 10 in a substrate results in serious necking feature at a portion in proximity to the surface of the substrate. The necking feature referred herein is to identify, in a transverse direction, a difference in size between a widest portion and a narrowest portion of the isolation structure. The more the difference between the widest portion and the narrowest portion, the more pronounced the necking feature. In some embodiments, the narrowest portion of the isolation region is about 0.5 μm below the surface of the substrate. The narrowest portion is vertically in conjunction with an undercut feature above, at the interface of the substrate and a hard mask positioned over the substrate, and vertically in conjunction with a local bowing feature below. In some embodiments, the widest portion can be identified in the bowing feature. To further quantify the degree of necking, a difference between a width of the widest portion and a width of the narrowest portion can be a way of measure.

One of the reasons contributing to the necking feature is due to lateral encroachment during the directional etch operation. A deeper trench requires a longer duration or a greater power used in the etching operation, and hence the lateral encroachment is more pronounced at forming a deeper trench. The necking feature can narrow the subsequent production window, for example, a deposition operation, such that the insulating or dielectric materials deposited cannot reach to the bottom of the deep trench. A method and a structure are proposed in the present disclosure to form a deep trench isolation structure having less severe necking feature, in order to achieve better isolation performances in various intended devices.

Figure 1:
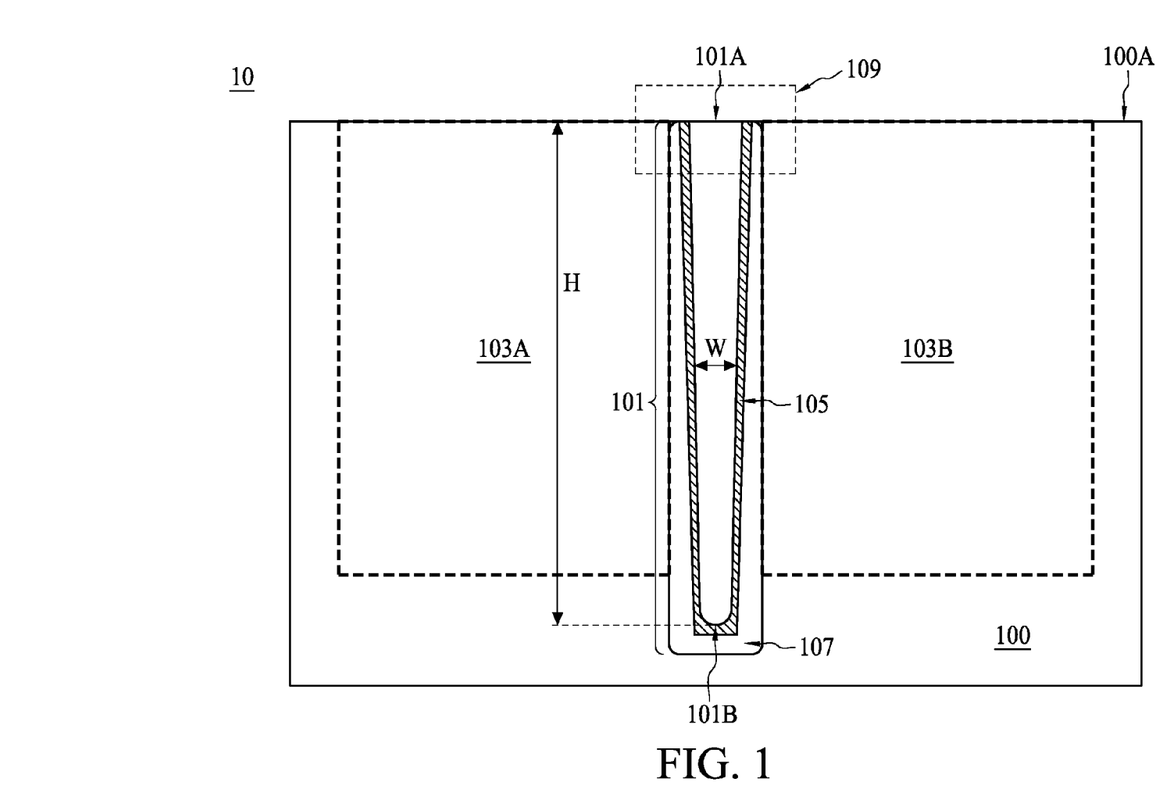
FIG. 1 is a cross sectional view of a semiconductor isolation structure, in accordance with some embodiments of the present disclosure.

Referring to FIG. 1, FIG. 1 is a semiconductor isolation structure 10 that could be implemented in various semiconductor devices such as a CMOS image sensor or a high voltage device, for isolating adjacent photosensitive regions and a high voltage region from a low voltage region, respectively. However, the semiconductor isolation structure 10 can be implemented in other semiconductor devices where isolating specific regions are required. In FIG. 1, an isolation region 101 is positioned in a substrate 100, separating two specific regions 103A and 103B. In some embodiments, the two specific regions 103A and 103B are two photosensitive regions function as photo diodes in a CMOS image sensing device. In other embodiments, the specific region 103A is a high voltage region, whereas the specific region 103B is a low voltage region. In some embodiments, the isolation region 101 is a trench in the substrate 100, filled with insulating materials such as oxides and/or nitrides. As can be seen from FIG. 1, an aspect ratio (H/W) is greater than about 18. In some embodiments, the aspect ratio is about 20. Although the trench is illustrated as having a tapered shape (wider at the top in proximity to a surface 100A of the substrate 100 and narrower at the bottom), it is not in a limiting sense that the isolation region 101 provided in the present disclosure be tapered. In some embodiments, the trench can have substantially vertical sidewalls such that the shape of the isolation region 101 is approximately rectangular or elongated elliptical.

The aspect ratio (H/W) shown in FIG. 1 refers to a ratio between a height H, measured from a top surface 101A to a bottom 101B of the isolation region 101, and a width W, calculated as an average width of the entire isolation region 101 if the isolation region 101 has a tapered or a trapezoidal shape, a width at the middle portion if the isolation region 101 has a rectangular or an elongated elliptical shape. Note that the sidewall and the bottom 101B of the isolation region are optionally surrounded by a liner layer 105. In some embodiments, the liner layer 105 is formed to passivate the dangling bonds or surface defect states that eventually contribute to leakage current. In addition, the isolation region 101 can, optionally, be further surrounded by a lightly doped well 107 having a doping polarity same as the substrate 100. The lightly doped well 107 can be either shallower (not shown in FIG. 1) or deeper (as shown in FIG. 1) than the height H of the isolation region 101. Alternatively, since the aspect ratio of the isolation region 101 presented in the present disclosure is greater than 18, the lightly doped well 107 can be omitted.

The bottom 101B of the isolation structure 101, that is, the lowest portion of the trench as shown in FIG. 1, can be a point rather than a flat surface. In order to have a lowest portion as a point, the bottom 101B of the isolation structure portion shall not be rounded. People having ordinary skill in the art shall understand that a rounded bottom refers to a bottom of a trench that is substantially flat. By controlling the parameters such as the type and composition of etching gas(es), etching rate, and the power used in a trench-formation operation, the bottom of a trench can possess a concave shape to further extend the substantial height H of the isolation structure 101.

Still referring to FIG. 1, the substrate 100 is a silicon substrate doped with a P-type dopant such as boron, in which case the substrate 100 is a P-type substrate. Alternatively, the substrate 100 could be another suitable semiconductor material. For example, the substrate 100 may be a silicon substrate that is doped with an N-type dopant such as phosphorous or arsenic, in which case the substrate 100 is an N-type substrate. The substrate 100 may include other elementary semiconductors such as germanium and diamond. The substrate 100 may optionally include a compound semiconductor and/or an alloy semiconductor. Further, the substrate 100 may include an epitaxial layer (epi layer), may be strained for performance enhancement, and may include a silicon-on-insulator (SOI) structure.

Figure 2:
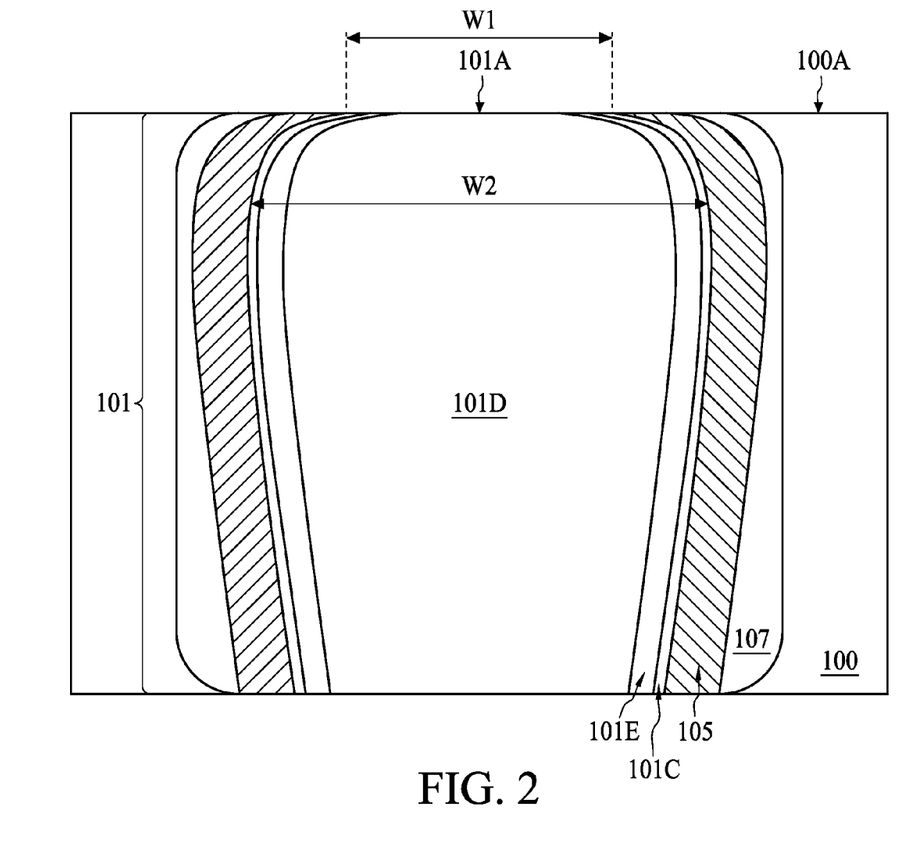
FIG. 2 is an enlarged view of a top portion of the semiconductor isolation structure of FIG. 1, in accordance with some embodiments of the present disclosure.

Still referring to FIG. 1, a narrowest portion in proximity to the top 101A of the isolation region 101 and a widest portion below the narrowest portion are positioned in the dotted box 109. FIG. 2 is an enlarged view of the portion of the isolation structure 101 enclosed in the dotted box 109 of FIG. 1. Referring to FIG. 2, elements labeled with identical numeral labels as those in FIG. 1 are referred to the same structure or equivalents thereof, and are not repeated here for simplicity. In FIG. 2, the top surface 101A of the isolation region 101 and the surface 100A of the substrate 100 are coplanar. A narrowest portion can be identified in proximity to the top surface 101A of the isolation region 101. In some embodiments, the narrowest portion possesses a width W1 at about 0.5 μm below the surface 100A of the substrate 100 (not shown in detail in FIG. 2). Below the narrowest portion situated a widest portion of the isolation region 101 with a width W2. The widest portion is often called a bowing portion as a result of trench formation in the substrate 100. In some embodiments, a ratio of the width W1 and the width W2 is greater than about 0.7. The closer the ratio to unity the better the subsequent operations, such as a deposition operation of insulating materials, introduced to form the isolation structure 101. In other embodiments, a difference between the width W1 and the width W2 is less than about 30 nm, given the average width of the trench below about 100 nm.

Referring to FIG. 2, the sidewall 101C of the isolation region 101 is defined as an interface between the insulating material 101D and the liner layer 105. In some embodiments, p-type doped silicon can be found in the liner layer 105, and thus a border (i.e. the sidewall 101C) of the isolation region 101 can be identified as an interface between an insulating material 101D and p-type doped silicon. In addition, in some embodiments, the sidewall 101C of the isolation region 101 is coated with nitrogen-containing compounds. The nitrogen-containing compounds include, but are not limited to, $Si_3N_4$, SiN, or the combinations thereof. Furthermore, in some embodiments, in addition to the nitrogen-containing compound described above, the sidewall 101C of the isolation region 101 is further coated with oxygen-containing compounds. The oxygen-containing compounds include, but are not limited to, silicon oxides such as $SiO_2$. A trace amount of the nitrogen-containing compounds and oxygen-containing compounds can be found at the sidewall 101C of the isolation region 101 as a result of introducing not only silicon-etching gas (fluorine-based gas), but also oxygen and nitrogen gas at a particular ratio range provided in the present disclosure. During the trench-formation operation, the nitrogen-containing compounds and oxygen-containing compounds is deposited, as a result of a series of chemical reaction, on the sidewall 101C of the isolation region 101 at a suitable amount sufficient to prevent undesired lateral encroachment. The control of the deposition of the nitrogen-containing compounds and oxygen-containing compounds render an isolation structure 101 shown in FIG. 1, having an aspect ratio greater than about 18, and simultaneously having a ratio of the narrowest portion and a widest portion of the isolation region 101 greater than about 0.7.

Still referring to FIG. 2, the liner layer 105 is positioned between the sidewall 101C and the lightly doped well 107. Trench-forming operations (such as etching operations) used to form a deep trenches may result in defects (such as dangling bonds) on the surfaces of the deep trenches. In a case that the isolation structure 10 shown in FIG. 1 is to be implemented in an image sensing device, for example, a CMOS image sensor, the above-mentioned defects may be physical defects or electrical defects and could trap carriers such as electrons. The trapped carriers may produce leakage current. Leakage current is problematic for an image sensing device. For example, with a sufficient amount of leakage current, radiation-sensing region (not formed yet at the etching operation) may falsely detect "light", even when the image sensing device is placed in an optically dark environment. Alternatively stated, the image sensing device may end up "sensing" light when it shouldn't have (since there is actually no light). In this situation, the leakage current may be referred to as a "dark current", and the pixel containing the radiation-sensing device may become what is referred to as a "white pixel". Dark currents and white pixels are forms of electrical cross-talk and degrade the performance of the image sensing device and are therefore undesirable. Therefore, the liner layer 105 is formed via a plasma diffusion operation to passivate the surface defects or dangling bonds and reduce leakage current.

In some embodiments of the present disclosure, an additional protection layer 101E can be optionally deposited over the sidewall 101C of the isolation region 101. The protection layer 101E can be chosen from insulating materials such as oxides or nitrides. For example, in one embodiment, the protection layer 101E may be a silicon dioxide layer between 20-200 angstroms thick, and further, may be an oxide/nitride stack where the nitride layer is between 20-200 angstroms thick.

Figure 3:
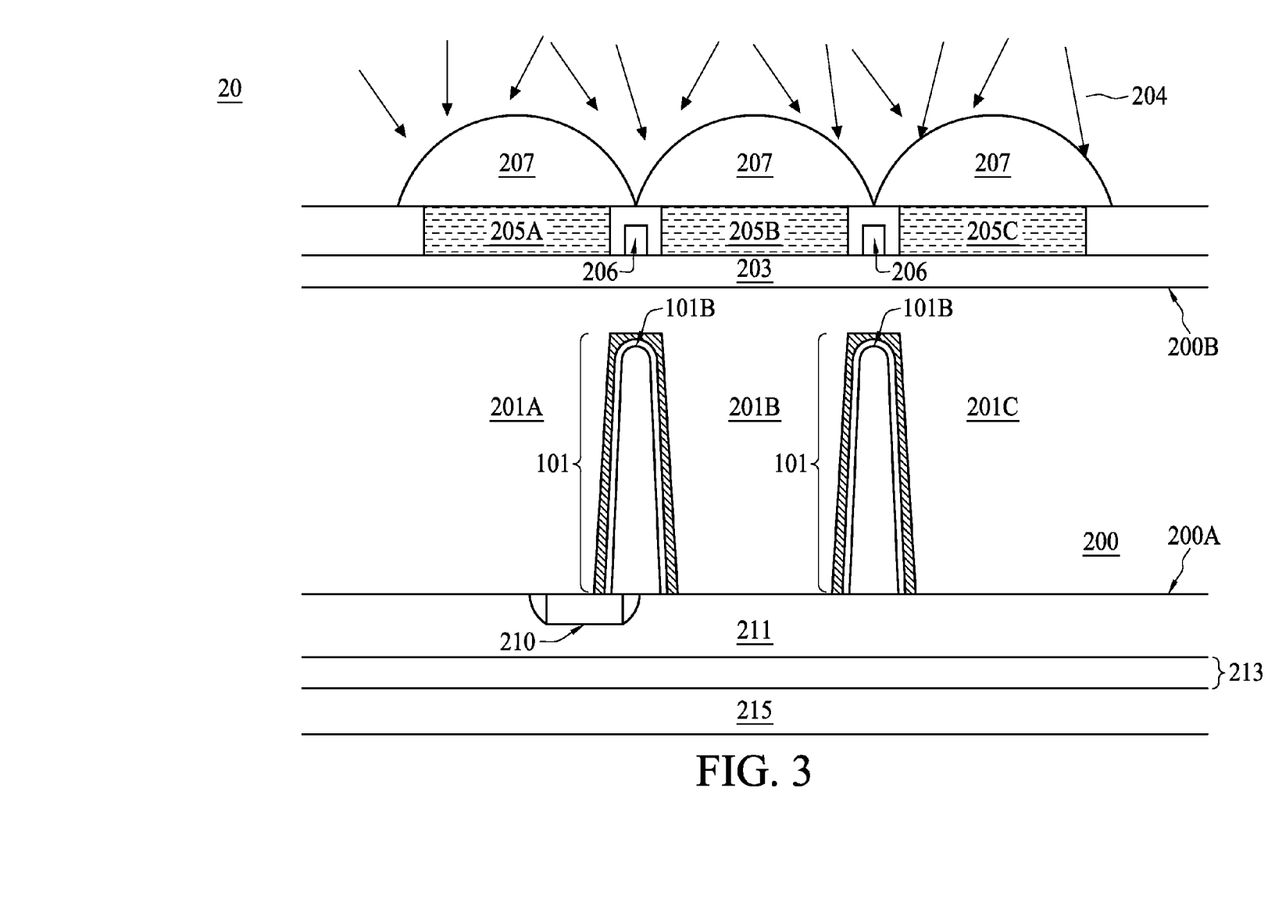
FIG. 3 is a cross sectional view of a semiconductor isolation structure in an image sensing device, in accordance with some embodiments of the present disclosure.

Referring to FIG. 3, FIG. 3 illustrates the isolation region 101 previously described being implemented in an image sensing device 20. In FIG. 3, three radiation detecting units 201A, 201B, 201C are separated by two isolation regions 101 in a layer 200 made of a substrate or an epitaxial-grown layer. The image sensing device 20 illustrated in FIG. 3 only shows a pixel-array region of an image sensing device. Other regions, for example, a peripheral region, a bonding pad region, and a scribe line region are not illustrated here for simplicity. The layer 200 possesses a front surface 200A in proximity to a conventional CMOS structure (including a layer stack of transistors, interconnects, etc.) and a back surface 200B facing a light-receiving end of the image sensing device 20. In some embodiments, the image sensing device 20 is a back-side illuminated (BSI) image sensor, as shown in FIG. 3. However, other image sensors having a front illumination design, a CCD pixel design, or a 3T, 4T, 5T, 6T, 7T pixel design are within the contemplated scope of the present disclosure.

Referring to FIG. 3, the front surface 200A of the layer 200 is in connection with active structures, such as a transistor 210, within each pixel. Note that while some embodiments of the present disclosure is described in terms of an n-channel transistors formed in a p-type substrate, the dopant types may be changed to accommodate p-channel transistors by using an n-type substrate. Additionally, the present disclosure is applicable to the formation of trench isolations with implanted isolating n-wells in the case where p-channel transistors are used. An interconnect layer 211 can be formed over the front surface 200A. The interconnect layer 211 includes a plurality of patterned dielectric layers and conductive layers that provide interconnections (e.g., wiring) between the various doped features, circuitry, and input/output of the image sensing device 20. The interconnect layer 211 includes an interlayer dielectric (ILD) and a multilayer interconnect (MLI) structure formed in a configuration such that the ILD separates and isolates each MLI structure from other MLI structures. The MLI structure includes contacts/vias and metal lines formed on the layer 200. For the sake of simplicity, these contacts/vias and metal lines are not illustrated in detail in FIG. 3.

A buffer layer 213 is further positioned over the interconnect layer 211 as an electrical isolation between the layer 200 and a carrier substrate 215. In some embodiments, the buffer layer 213 includes a dielectric material such as silicon oxide. Alternatively, the buffer layer 250 may optionally include silicon nitride. The carrier substrate 215 is bonded with the buffer layer 213 so that processing of the back surface 200B of the layer 200 can be performed. The carrier substrate 215 may be similar to the layer 200 and includes a silicon material. Alternatively, the carrier substrate 215 may optionally include a glass substrate.

The back surface 200B of the layer 200 is in connection with a light-receiving end including a passivation layer 203, color filters 205A, 205B, 205C, and micro lens 207. Incident light 204 from various angles impinges the micro lens 207, passes through and color filters 205A, 205B, 205C, finally reaches the radiation detecting units 201A, 201B, 201C to generate photocurrent. In some embodiments, reflective post 206 is formed between adjacent color filters to prevent cross contamination of photons in adjacent pixels. As previously discussed in FIG. 1 and FIG. 2, in some embodiments, the proposed isolation region 101 illustrated in FIG. 3 possesses an aspect ratio of more than 18, for example, about 20. In other embodiments, the W1 to W2 ratio of the isolation region 101 is greater than about 0.7, in order to facilitate a better filling of the insulating materials in the trench of the isolation region 101. In some embodiments, a difference between the width W1 and the width W2 is less than about 30 nm, given that a lateral critical dimension of the isolation region 101 is lower than about 90 nm.

Figure 4:
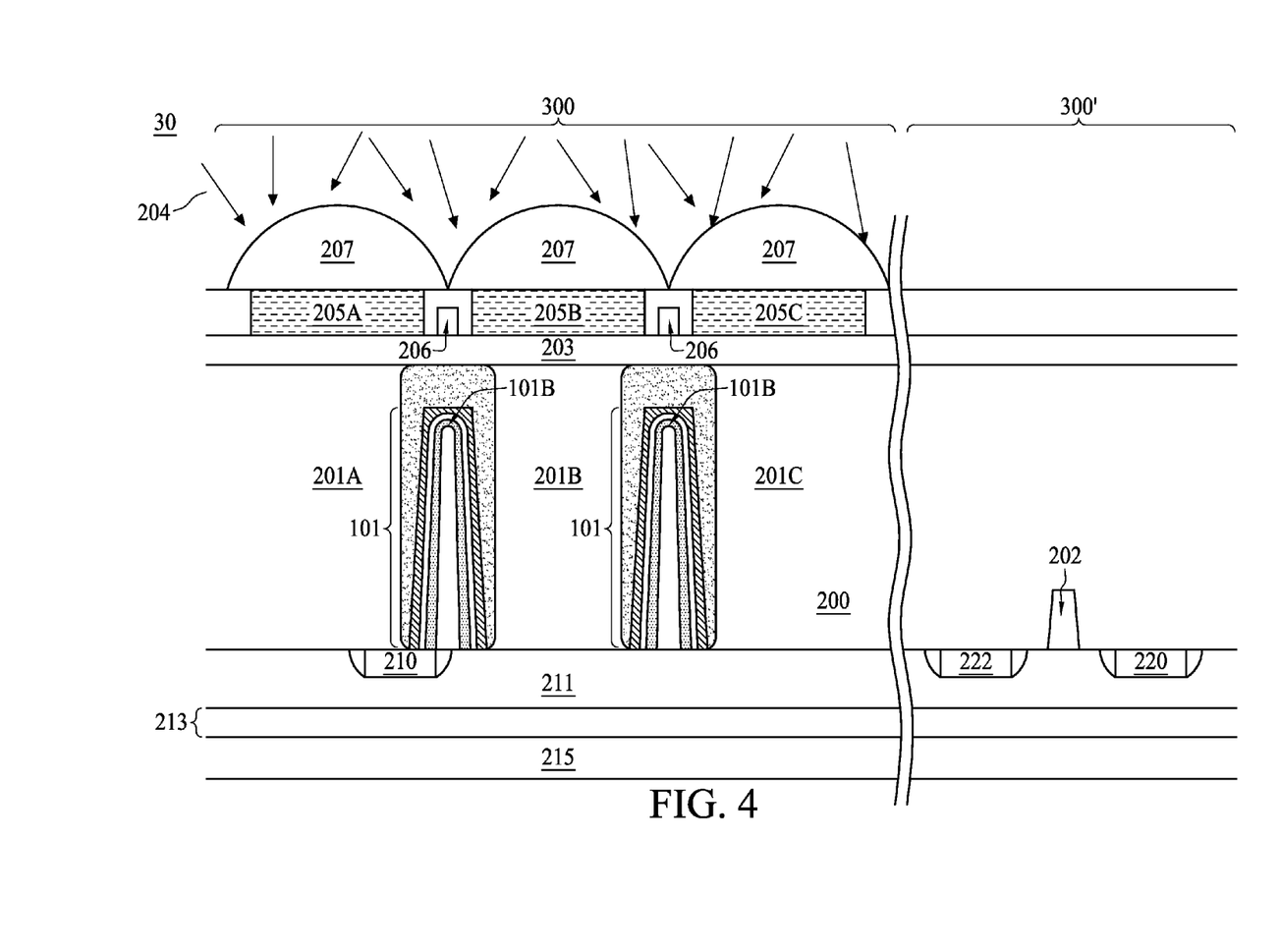
FIG. 4 is a cross sectional view of a semiconductor isolation structure in an image sensing device, in accordance with some embodiments of the present disclosure.

Referring to FIG. 4, an image sensing device 30 includes a radiation sensing region 300 and a peripheral region 300'. Elements in FIG. 4 labeled with identical numeral labels as those in FIG. 3 are referred to the same structure or equivalents thereof, and are not repeated here for simplicity. The radiation sensing region 300 in FIG. 4 is similar to the portion of the image sensing device 20 provided in FIG. 3, except for that the first isolation region 101 in the radiation sensing region 300 further includes lightly doped well 107. In some embodiments, the lightly doped well 107 extends through the thickness of the layer 200, as illustrated in FIG. 4. Alternatively, since the aspect ratio of the first isolation region 101 presented in the present disclosure is greater than about 18, the lightly doped well 107 can only extend a portion of the thickness (not shown) of the layer 200, or even be omitted (not shown). In FIG. 4, transistors 220 and 222 may be formed on either side of a second isolation region 202 in the periphery region 300'. The transistors 220 and 222 may each include a gate, a source, and a drain, and may be formed in a doped well. The transistors 220 and 222 may include devices that need to be kept optically dark. These devices may be digital devices, such as application-specific integrated circuit (ASIC) devices or system-on-chip (SOC) devices. In addition to the transistors 220 and 222, the periphery region 300' may further include reference pixels (not illustrated) that are used to establish a baseline of an intensity of light for the image sensing device 30.

Still referring to FIG. 4, one difference between the first isolation region 101 and the second isolation region 202 is that the first isolation region 101 is positioned in the radiation sensing region 300, separating adjacent radiation detecting units (201A, 201B, 201C), whereas the second sensing region 202 is placed in the peripheral region, separating adjacent transistors (222, 220). In some embodiments, the first isolation region 101 possesses a depth of more than 1 micron, for example, between 2 to 3 microns. However, the second isolation region 202 may have a depth less than 1 micron, shallow trench isolation (STI) can be one example of the second isolation region 202.

As discussed previously, the first isolation region 101 in the radiation sensing region 300 has a sidewall 101C coated with nitrogen-containing compounds or SiN-based composites. Similarly, the sidewall can also be coated with oxygen-containing compounds or silicon dioxide-based composites. The type of the nitrogen-containing compounds and oxygen-containing compounds can be referred to the description for FIG. 2 and is not repeated here for simplicity. Furthermore, a protection layer 101E is further deposited over the sidewall 101C where the nitrogen- and oxygen-containing compounds are coated thereon. As can be seen in FIG. 4, instead of having a flat surface (or called a rounded bottom), the bottom 101B of the first isolation region 101 has a concave shape.

Figure 5:
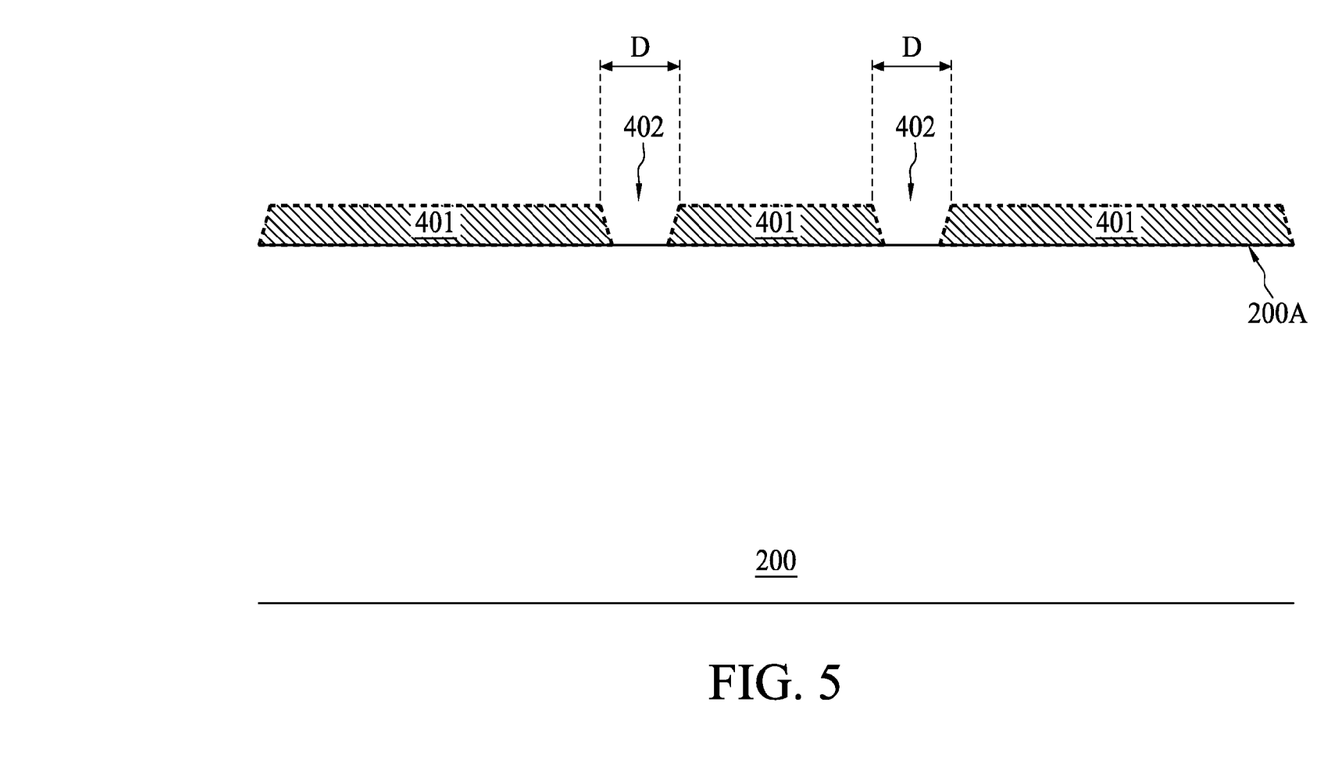
FIG. 5 to FIG. 12 are diagrammatic fragmentary cross sectional views of respective image sensing devices at a manufacturing operation in accordance with various alternative embodiments of the present disclosure.

FIG. 5 to FIG. 12 are diagrammatic fragmentary cross sectional views of respective image sensing devices at a manufacturing operation in accordance with some embodiments of the present disclosure. In FIG. 5, a layer 200 having a top surface 200A is provided. The layer 200 can be a substrate utilized for subsequent manufacturing operation. The types of the substrate can be referred to the description of FIG. 1 previously discussed. On the top surface 200A resides a patterned mask 401. In some embodiments as shown in FIG. 5, the patterned mask 401 includes several openings 402 viewing from a cross sectional perspective. From a top view, the openings 402 may be boundaries surrounding a pixel in a pixel-array region of an image sensing device. In some embodiments, a critical dimension D of the openings 402 can be less than 90 nm. In some embodiments, the dimensions of the individual openings 402 are not identical, that is, some dimensions of the openings are greater than others. The patterned mask 401 can be made of materials thick enough for a directional etching operation performed subsequently at a given power level. In some embodiments, a thickness of the patterned mask 401 is made of photoresist less than about 2 μm thick.

Figure 6:
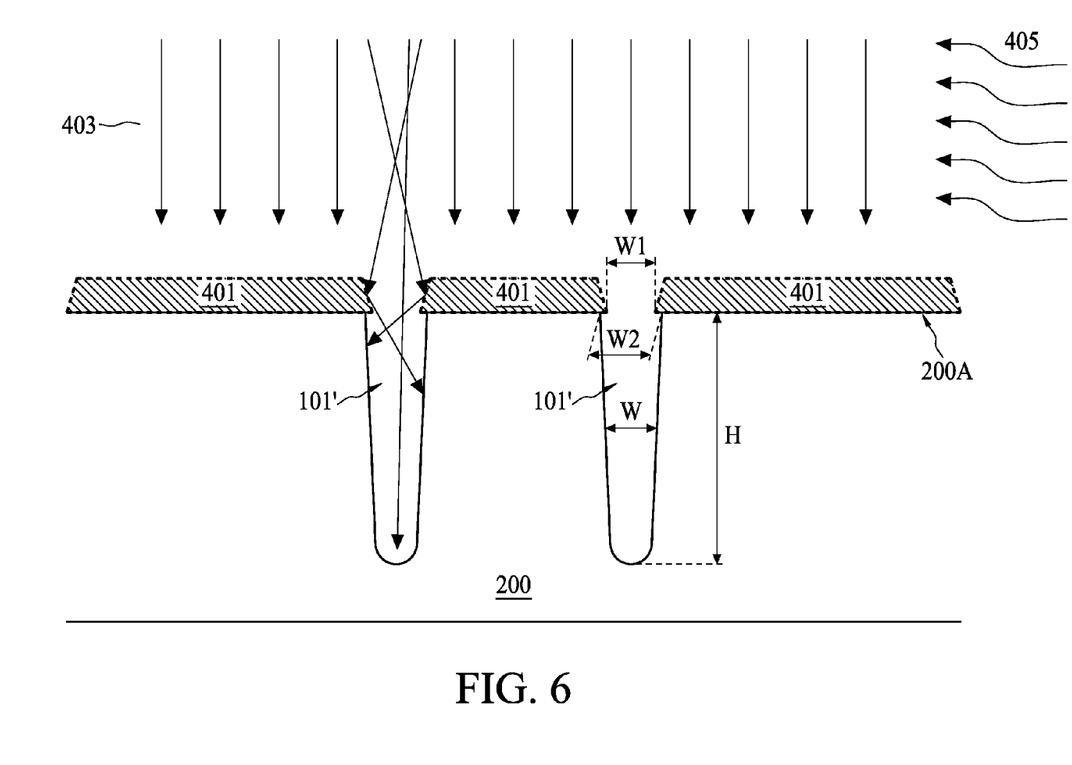

Referring to FIG. 6, a trench 101' having an aspect ratio of greater than about 18 is formed by a directional etch operation. The calculation of the aspect ratio (H/W) is previously described in FIG. 1. In addition, by using the directional etch operation provided in the present disclosure, a ratio of the narrowest portion (W1) and the widest portion (W2) of the trench 101' is greater than about 0.7. A more clear description for W1 and W2 is previously provided in FIG. 2. The trenches 101' have a depth H that is in a range from approximately 1 μm to approximately 5 μm. The trenches 101' may have approximately rectangular shapes, trapezoidal shapes, elongated elliptical shapes, or other suitable shapes. The materials exposed from the openings 402 of the patterned mask 200A are etched further into the pixel-array region of the layer 200 to form deep trenches 101', for example by using a dry etching process known in the art. In some embodiments, the etching operation includes a reactive ion etch (RIE) with a chamber pressure of 0~60 mtorr and an RF power of 300~900 W. High-energy ions 403 from the plasma attack the layer surface 200A and react with it. Alternatively, a deep RIE technique can also be used to form a trench with an aspect ratio described herein.

In the RIE operation discussed above and illustrated in FIG. 6, the gas(es) 405 used for the trench-forming operation includes fluorine-containing substance and nitrogen-containing substance. In some embodiments, for example, the fluorine-containing substance includes $SF_6$ or its equivalents, and the nitrogen-containing substance includes nitrogen gas. However, in other embodiments, the nitrogen-containing substance can be replaced by other substance that is resistant from the attack of the fluorine-containing substance. The substance that is resistant from the attack of the fluorine-containing substance can react with other substances introduced into the chamber during the directional etching operation and form a thin coating deposited on the sidewall 101C of the trench 101' to prevent further consumption of the materials composing the layer 200, for example, silicon.

Referring to FIG. 6, in some embodiments, the gas(es) 405 used for the trench-forming operation further includes oxygen-containing substance. In some embodiments, the gas flow ratio of the nitrogen-containing substance and the fluorine-containing substance is in a range of from about 0.8 to about 4. Trench formed under this operation condition can achieve an aspect ratio more than about 18 and a non-rounded bottom. It is more desirable that the surface of the trench bottom is not flat (rounded), or demonstrating an etch-stop phenomenon, but with a curvature. In other embodiments where the oxygen-containing substance is used in the RIE operation in addition to the nitrogen-containing substance and the fluorine-containing substance, the gas flow ratio of the oxygen-containing substance and the fluorine-containing substance is about 1. In still other embodiments, the gas flow ratio of the nitrogen-containing substance, the oxygen-containing substance, and the fluorine-containing substance is approximately 0.8:1:1. The range of the gas(es) flow ratio can from a suitable coating over the sidewall 101C and the bottom of the trench 101' that is thick enough to prevent further lateral erosion and thin enough to prevent the etch-stop phenomenon from occurring. In some embodiments, the coating includes $Si_3N_4$, SiN, silicon oxides such as $SiO_2$, or the combinations thereof, as described previously.

Figure 7:
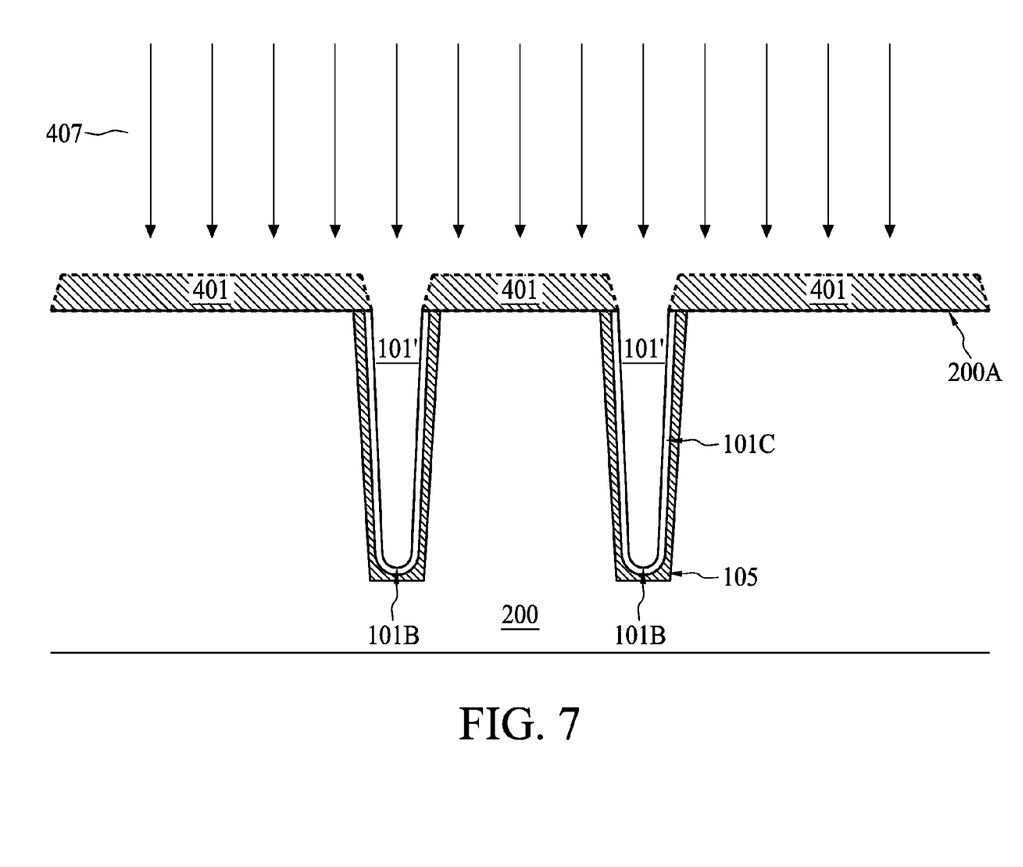

Referring to FIG. 7, a liner layer 105 is formed by a shallow P-implant 407 operation (or a plasma diffusion operation) in order to passivate the surface states and localized defects and to prevent generation of electrons near the trench 101'. In one embodiment, the P-type implant has a dopant concentration of 5E11 to 2E13 ions/$cm^2$ and implanted with energy of about 5 to about 100 keV. Note that the passivating P-implant is optional. In some embodiments, a plasma diffusion operation is performed on the trenches 101' while using the patterned hard mask layer 401 as a protective mask. The plasma diffusion operation may involve a plasma-immersion ion implantation, and may achieve a dopant depth in a range from about 500 angstroms to about 2500 angstroms, and a dosage range in a range from about 1E10 ions/cm$^2$ to about 1E14 ions/cm$^2$. As a result of the plasma diffusion operation, doped trench liners 105 are respectively formed around the deep trenches 101'. The doped trench liners 105 are essentially formed by doping portions of the layer 200 surrounding the sidewall and the bottom of the trenches 101' with the dopant used in the plasma diffusion operation.

Figure 8:
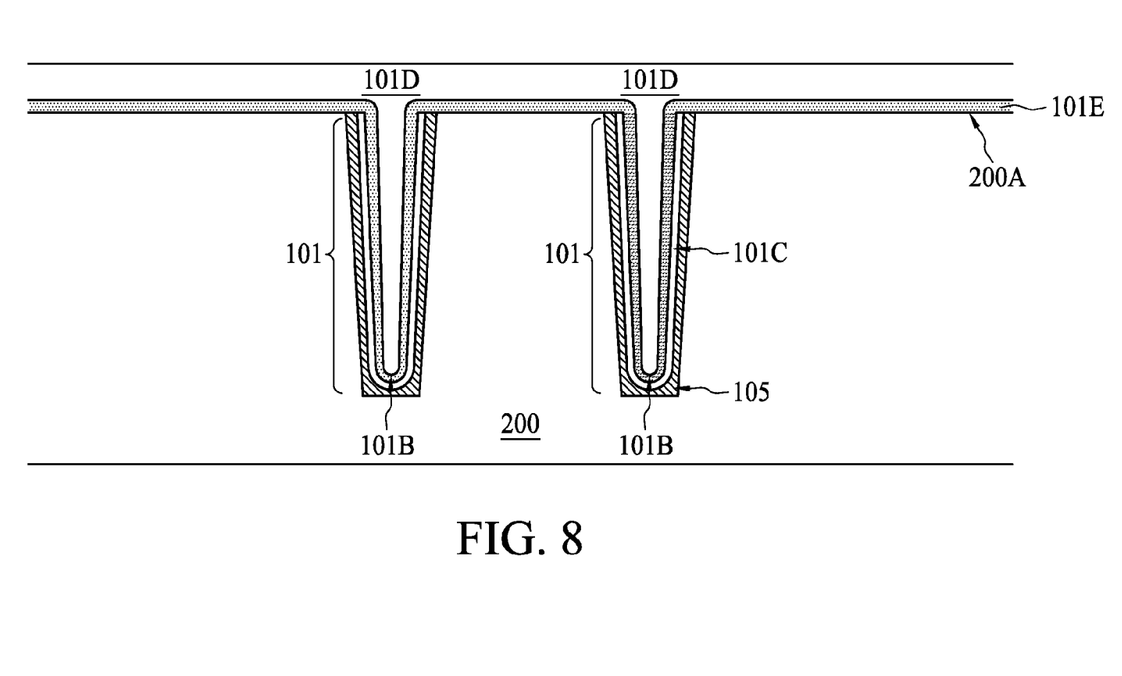

Referring to FIG. 8, a protection layer 101E and an insulating material 101D are subsequently deposited over the trench of the isolation region 101. In FIG. 8, forming the protection layer 101E over the coating of the sidewall 101C and over the top surface 200A is an optional operation. In some embodiments, the protection layer 101E may be between 20-200 angstroms thick, and further, may be an oxide stack. Insulating materials 101D such as oxides are further deposited to overfill and close the trench openings. In some embodiments, the oxide may be a high density plasma chemical vapor deposition (HDPCVD) oxide. The HDP-CVD oxide is chosen for its ability to fill high aspect ratio openings; however any type of oxide or dielectric may be used to form the deep trench isolation 601. Alternatively, a spin-on-glass (SOG) may be used to fill the deep trench isolation opening. After the formation of the HDPCVD or SOG oxide, a chemical mechanical processing (CMP) step may be used to planarize the surface such that the insulating materials 101D and the protection layer 101E are removed to the extent that the top surface 200A being exposed (not shown in FIG. 8). Note that the embodiment of FIG. 8 does not require the use of a lightly doped P-well because of the sufficient depth of the isolation region 101.

FIG. 9 to FIG. 12 illustrate fragmentary views on manufacturing operation for a back-side illuminated (BSI) image sensing device. However, the image sensing device using the isolation region disclosed in the present disclosure is not limited to the BSI image sensor, other image sensors, such as a traditional front-side illuminated image sensor or a CCD are encompassed in the contemplated scope of the present disclosure.

Figure 9:
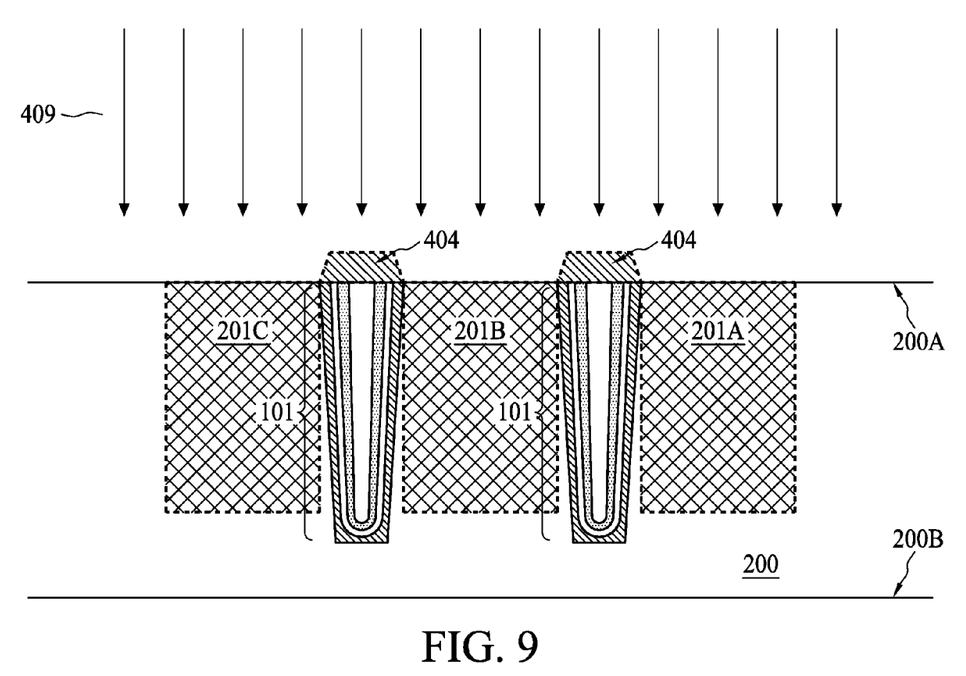

Referring to FIG. 9, after the planarization operation, a radiation-detecting region including some radiation-detecting units is formed by an ion implantation operation on the front surface 200A of the layer 200. The ion implantation process implants the layer 200 with a dopant having an opposite doping polarity as the layer 200. For example, in an embodiment where the layer 200 is a P-type substrate, the radiation-detecting units 201A, 201B, 201C are doped with an N-type dopant. In another embodiment where the layer 200 is an N-type substrate, the radiation-detecting units 201A, 201B, 201C are doped with a P-type dopant. Thus, the doping polarity of the radiation-detecting units 201A, 201B, 201C are opposite from the doping polarity of the layer 200 and the doping polarity of the doped trench liner layers 105. Note in FIG. 9, the isolation region 101 is protected by a patterned mask 404 shielding the isolation region 101 from ion bombardment 409.

Figure 10:
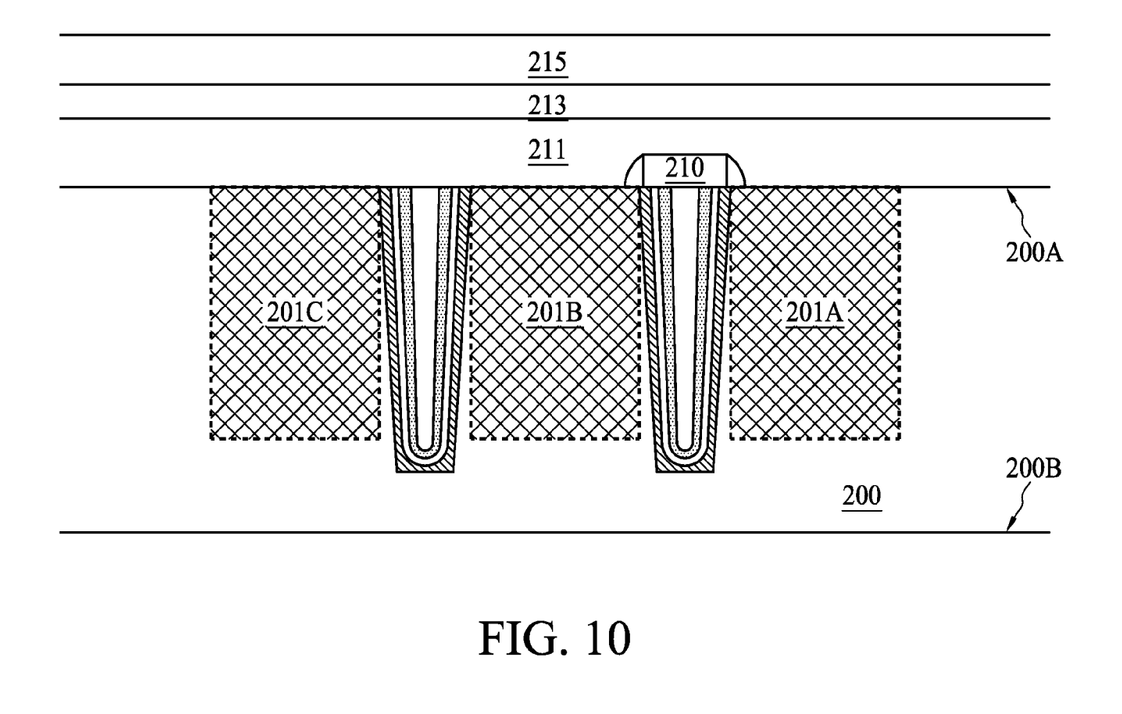
Figure 11:
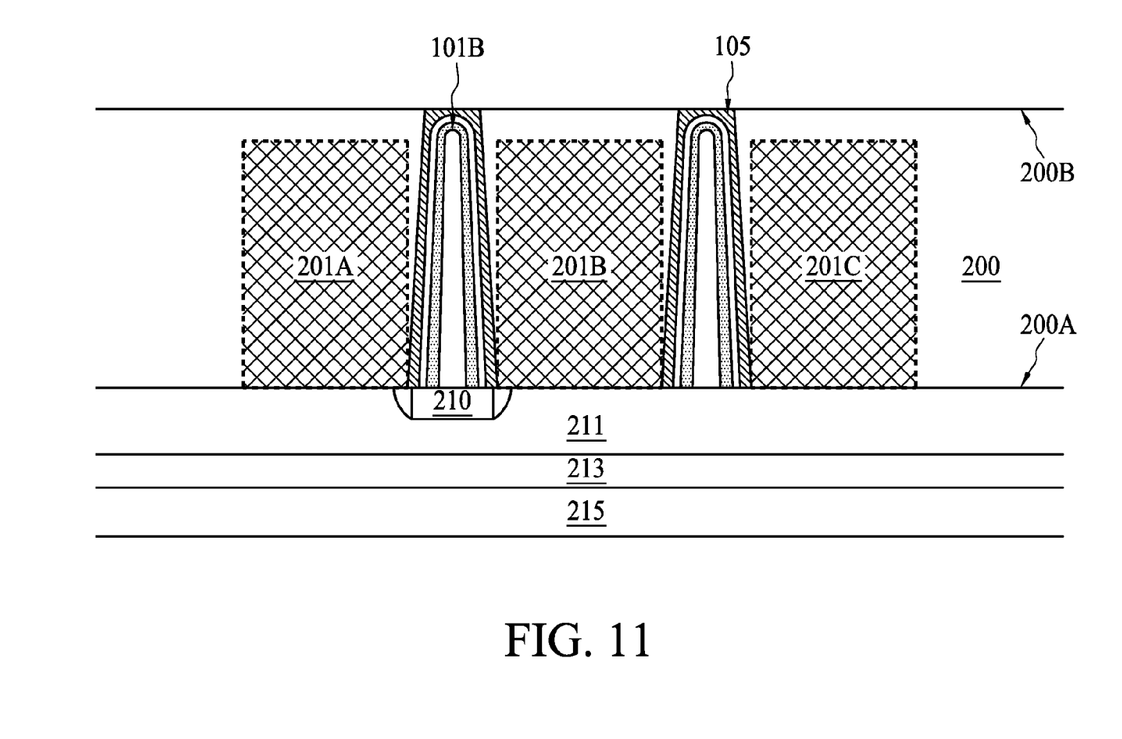

Referring to FIG. 10 and FIG. 11, a stack including an interconnect layer 211, a buffer layer 213, and a carrier substrate 215 is further formed over the front surface 200A of the layer 200. A transistor 210 can be formed in the interconnect layer. In some example, the interconnect layer may include conductive materials such as aluminum, aluminum/silicon/copper alloy, titanium, titanium nitride, tungsten, polysilicon, metal silicide, or combinations thereof, being referred to as aluminum interconnects. Aluminum interconnects may be formed by a process including PVD, CVD, or combinations thereof. Other manufacturing techniques to form the aluminum interconnect may include photolithography processing and etching to pattern the conductive materials for vertical connection (contacts/vias) and horizontal connection (conductive lines). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes. In some embodiments, the buffer layer 213 is formed by CVD, PVD, or other suitable techniques. The buffer layer 213 is planarized to form a smooth surface by a chemical-mechanical-polishing (CMP) process. Detailed description of other layers in the stack can be referred to the section describing FIG. 3 of the present disclosure. In FIG. 11, the structure shown in FIG. 10 is held upside-down and the bottom surface 200B of the layer 200 is thinned down to the extent that the bottom of the implanted liner layer 105 is exposed. In some embodiments, the carrier substrate 215 supports the image sensing device while the thinning operation is being performed.

Figure 12:
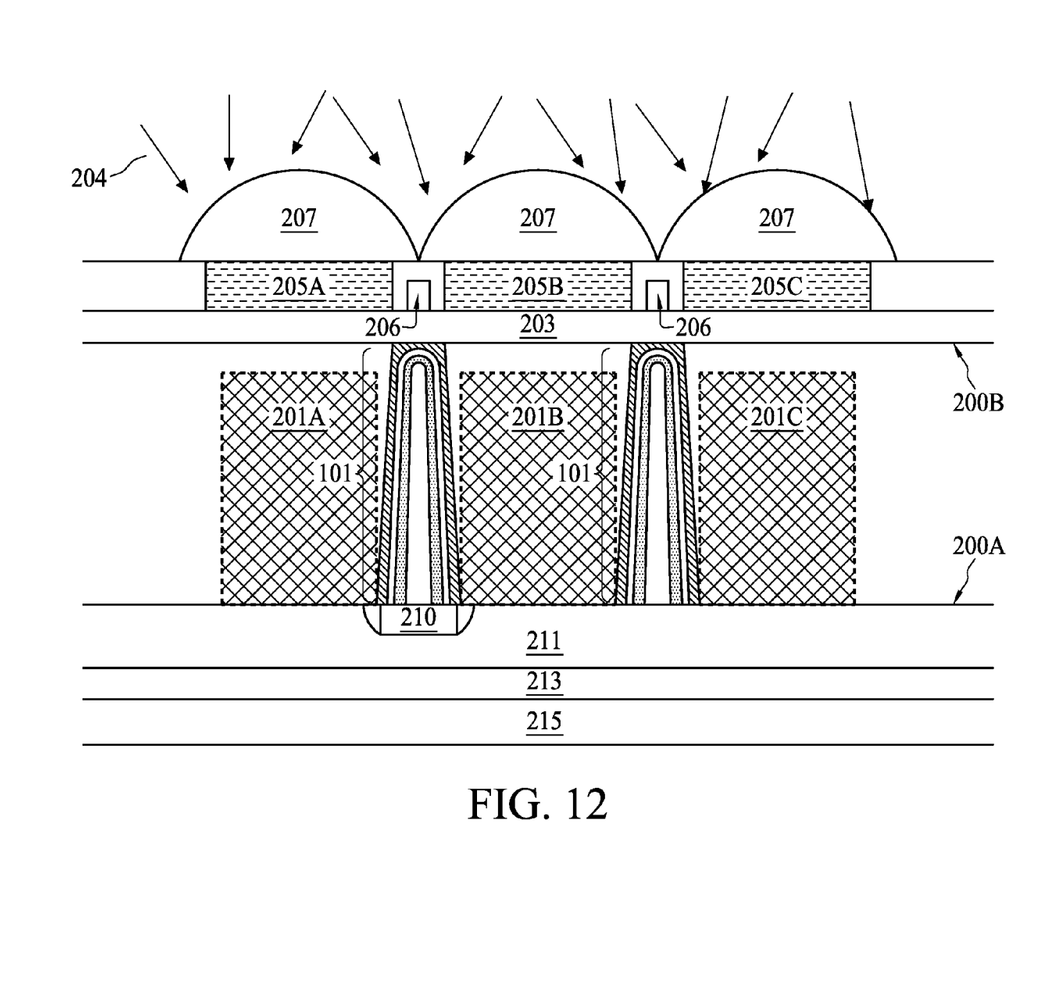

Referring to FIG. 12, on the back surface 200B of the layer 200, a passivation layer 203, color filters 205A, 205B, 205C, and micro lens 207 are subsequently formed. Furthermore, the reflective post 206 is formed in the same layer as the color filter and being positioned between adjacent color filters to prevent cross contamination of photons in adjacent pixels. The impinging photons 204 are therefore entering the image sensing device through a back surface 200B. At the presence of high aspect ratio isolation region 101, the photons entering a particular radiation detecting unit (one of 201A, 201B, 201C) are barred from travelling to the adjacent radiation detecting unit, and thus cross contamination of the incoming signal can be reduced.

Some embodiments of the present disclosure provide a semiconductor isolation structure, the structure includes a substrate, an isolation region in the substrate. The isolation region is filled with insulating materials. The isolation region further includes an aspect ratio greater than about 18, a narrowest portion in proximity to a top of the isolation region, and a widest portion below the narrow portion. A ratio of a width of the narrowest portion and a width of the widest portion of the isolation region is greater than about 0.7.

In some embodiments of the present disclosure, the isolation region further includes a sidewall coated with nitrogen-containing compounds.

In some embodiments of the present disclosure, the isolation region further includes a non-rounded bottom.

In some embodiments of the present disclosure, the isolation region is positioned in a pixel-array region of an image sensing device, separating adjacent radiation-detection units in the pixel-array region In some embodiments of the present disclosure, the sidewall of the isolation region is further coated with oxygen-containing compounds.

In some embodiments of the present disclosure, a difference between the width of the widest portion and the width of the narrowest portion of the isolation region is less than about 30 nm.

Some embodiments of the present disclosure provide an image sensing device including a radiation sensing region with a first isolation region separating adjacent radiation detecting units and a peripheral region. An aspect ratio of the first isolation region is greater than about 18.

In some embodiments of the present disclosure, a ratio of a width of a narrowest portion and a width of a widest portion of the first isolation region is greater than about 0.7.

In some embodiments of the present disclosure, the first isolation region further includes a sidewall with SiN-based composites.

In some embodiments of the present disclosure, the sidewall of the isolation region further includes a protection layer over the SiN-based composites.

In some embodiments of the present disclosure, a bottom of the first isolation region possesses a concave shape.

In some embodiments of the present disclosure, a difference between the width of the widest portion and the width of the narrowest portion is less than about 30 nm.

Some embodiments of the present disclosure provide a method for manufacturing a semiconductor isolation structure, the method includes providing a substrate with a top surface, forming a patterned mask over the top surface, forming a trench through the patterned mask in the substrate by a directional etch comprising nitrogen-containing substance, and filling the trench with insulating materials. Wherein an aspect ratio of the trench is formed to be greater than about 18, and a ratio of a width of a narrowest portion and a width of a widest portion of the isolation region is formed to be greater than about 0.7

In some embodiments of the present disclosure, wherein the forming the trench through the patterned mask in the substrate by the directional etch further includes fluorine-containing substance.

In some embodiments of the present disclosure, the forming the trench through the patterned mask in the substrate by the directional etch further includes oxygen-containing substance.

In some embodiments of the present disclosure, the forming the patterned mask over the top surface includes forming the patterned mask exposing a portion of the top surface of the substrate, and a critical dimension of the pattern on the mask is less than about 90 nm.

In some embodiments of the present disclosure, the forming the trench through the patterned mask in the substrate by the directional etch further includes introducing the nitrogen-containing substance and the fluorine-containing substance within a ratio of from about 0.8 to about 4.

In some embodiments of the present disclosure, the forming the trench through the patterned mask in the substrate by the directional etch further includes introducing the oxygen-containing substance and the fluorine-containing substance at a ratio of about 1.

In some embodiments of the present disclosure, the forming the trench through the patterned mask in the substrate by a directional etch includes introducing nitrogen gas and $SF_6$.

In some embodiments of the present disclosure, the method further includes forming a radiation-detecting unit by an ion implantation operation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor isolation structure, comprising:
   providing a substrate with a top surface;
   forming a patterned mask over the top surface;
   forming a trench through the patterned mask in the substrate by a directional etch comprising nitrogen-containing substance, fluorine-containing substance, and oxygen-containing substance, wherein an aspect ratio of the trench is formed to be greater than about 18, and a ratio of a width of a narrowest portion and a width of a widest portion of the isolation region is formed to be greater than about 0.7, nitrogen-containing substance and the fluorine-containing substance being introduced within a ratio of from about 0.8 to about 4; and
   filling the trench with insulating materials.

2. The method for manufacturing a semiconductor isolation structure of claim 1, wherein the forming the patterned mask over the top surface comprises forming the patterned mask exposing a portion of the top surface of the substrate, and a critical dimension of the pattern on the mask is less than about 90 nm.

3. The method for manufacturing a semiconductor isolation structure of claim 1, wherein the forming the trench through the patterned mask in the substrate by the directional etch further comprises introducing the oxygen-containing substance and the fluorine-containing substance at a ratio of about 1.

4. The method for manufacturing a semiconductor isolation structure of claim 1, wherein the forming the trench through the patterned mask in the substrate by a directional etch comprises introducing nitrogen gas and $SF_6$.

5. A method for manufacturing an image sensing device, comprising:
   forming a first isolation region by forming a patterned mask over a surface of a substrate;
   forming a trench through the patterned mask in the substrate by a directional etch comprising nitrogen-containing substance, wherein an aspect ratio of the trench is formed to be greater than about 18, the trench with a ratio of a width of a narrowest portion and a width of a widest portion thereof being greater than about 0.7;
   filling the trench with insulating materials; and
   forming a second isolation region at a peripheral region of the substrate;
   wherein the patterned mask is positioned in a radiation sensing region, separating adjacent radiation detecting units, and
   wherein the widest portion of the trench is configured to be positioned opposite to a radiation-receiving surface of the image sensing device.

6. The method of claim 5, wherein the forming the trench through the patterned mask further comprises forming a SiN-based composite layer over a sidewall of the trench.

7. The method of claim 5, wherein the forming the trench through the patterned mask further comprises forming a SiO-based composites layer over a sidewall of the trench.

8. The method of claim 6, further comprising forming a protection layer over the SiN-based composite layer by forming an oxide stack with a thickness of from about 20 to about 200 angstroms.

9. The method of claim 5, wherein the directional etch further comprises fluorine-containing substance and oxygen-containing substance.

10. The method of claim 5, wherein the directional etch is configured to obtain a concave bottom in the trench.

11. The method of claim 1, wherein the forming the trench through the patterned mask further comprises forming a SiN-based composite layer over a sidewall of the trench.

* * * * *